United States Patent
Sakashita et al.

[11] Patent Number: 5,864,495
[45] Date of Patent: *Jan. 26, 1999

[54] ARITHMETIC PROCESSING APPARATUS AND ARITHMETIC PROCESSING CIRCUIT

[75] Inventors: Yukihiko Sakashita, Hadano; Hayao Ohzu, Tokyo; Akihiro Ouchi, Isehara, all of Japan

[73] Assignee: Canon Kabushiki Kaisha, Tokyo, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 591,343

[22] Filed: Jan. 25, 1996

[30] Foreign Application Priority Data

Jan. 30, 1995 [JP] Japan ................................ 7-012912

[51] Int. Cl.$^6$ ...................................................... G06G 7/00
[52] U.S. Cl. ............................................................ 364/807
[58] Field of Search ................................. 364/769, 807; 340/146.2

[56] References Cited

U.S. PATENT DOCUMENTS

| | | | |
|---|---|---|---|
| 5,010,338 | 4/1991 | Miki et al. ............................... | 341/159 |
| 5,149,989 | 9/1992 | Oguchi et al. ........................... | 307/311 |
| 5,329,172 | 7/1994 | Kohdaka ................................. | 307/355 |
| 5,343,419 | 8/1994 | Shu et al. ................................ | 364/807 |
| 5,420,806 | 5/1995 | Shou et al. .............................. | 364/606 |
| 5,428,237 | 6/1995 | Yuzurihara et al. ..................... | 257/349 |
| 5,466,961 | 11/1995 | Kikuchi et al. ......................... | 257/379 |

FOREIGN PATENT DOCUMENTS

| | | |
|---|---|---|
| 0569856 | 11/1993 | European Pat. Off. . |
| 2536922 | 6/1984 | France . |
| 2599526 | 12/1987 | France . |
| 4402952 | 6/1994 | Germany . |
| 01-081082 | 3/1989 | Japan . |
| 2184621 | 6/1987 | United Kingdom . |

OTHER PUBLICATIONS

"Tips for Straddling the 3–v to 5–v Fence", B.C. Martin, *Electronic Design*, vol. 42, No. 7, pp. 67–68 and 70–73 (Apr. 4, 1994).

"An Economical Majority Logic IC Materialized by the CMOS", *Nikkei Electronics*, pp. 132–144 (Nov. 5, 1973).

"CMOS Analog Circuit Design" by Phillip E. Allen et al. p. 534, 1987.

*Primary Examiner*—Tan V. Mai
*Attorney, Agent, or Firm*—Fitzpatrick, Cella, Harper & Scinto

[57] ABSTRACT

An arithmetic processing apparatus or circuit for performing charge redistribution by one or more capacitances connected to an input portion of each comparator are realized with improved arithmetic accuracy as suppressing dispersion and errors of gains of signals input into comparators, in such an arrangement that as the arithmetic processing apparatus is arranged to have a plurality of comparators, each having one or more capacitances connected to the input portion thereof, a sum of the capacitors connected to the input portions of each comparators 71 (or 72), $C_{11}+\ldots+C_{1n}$ (or $C_{81}+\ldots+C_{8m}$), is substantially equalized among the plurality of comparators, or a ratio of the sum of the capacitors connected to the input portion of each comparator 71 (or 72), $C_{11}+\ldots+C_{1n}$ (or $C_{81}+\ldots+C_{8m}$), and input capacitance $C_{p1}$ (or $C_{p2}$) of the comparator is substantially equalized among the comparators.

11 Claims, 6 Drawing Sheets

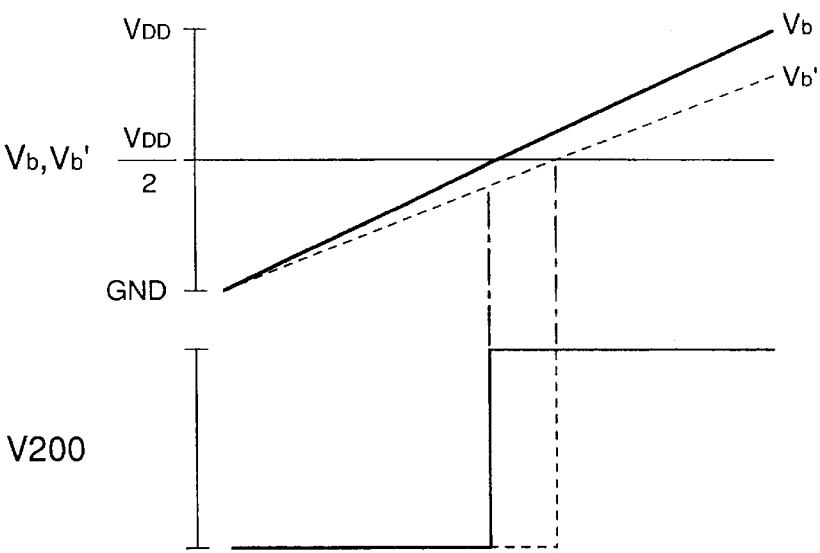
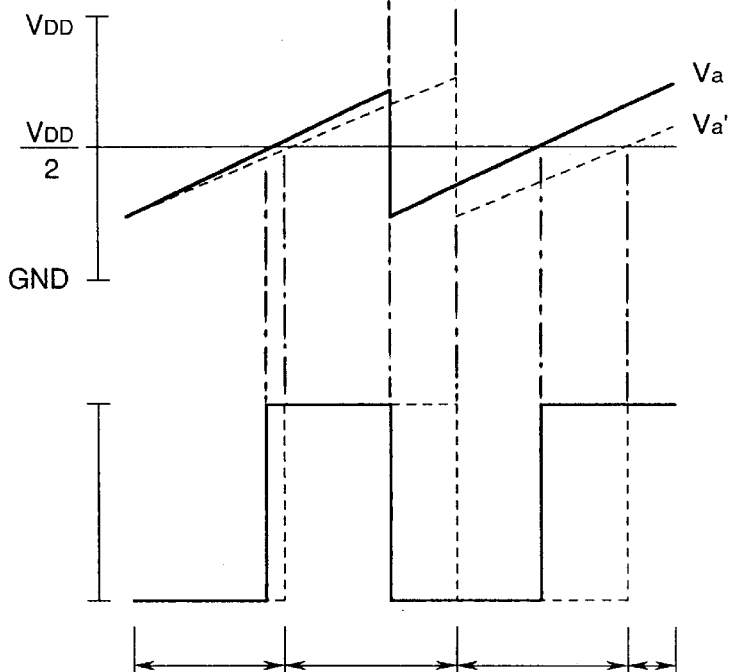
FIG.6A $V_b, V_b'$
FIG.6B V200
FIG.6C $V_a, V_a'$
FIG.6D V201

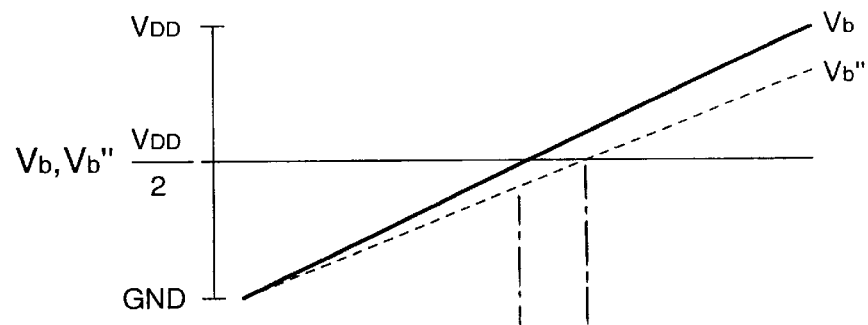
FIG.7A $V_b, V_b''$
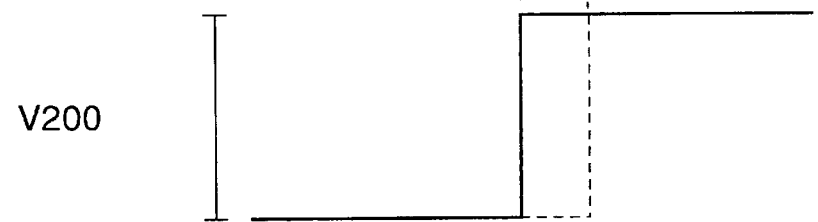
FIG.7B V200
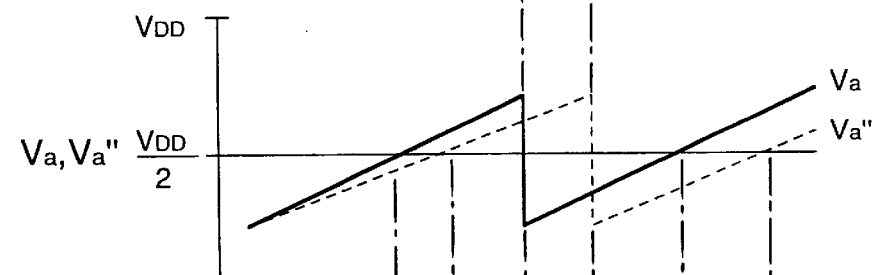
FIG.7C $V_a, V_a''$
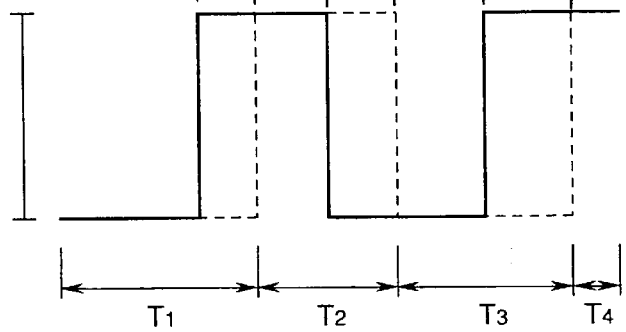
FIG.7D V201

ARITHMETIC PROCESSING APPARATUS AND ARITHMETIC PROCESSING CIRCUIT

BACKGROUND OF THE INVENTION

1. Field of the Invention

The present invention relates to an arithmetic processing apparatus and an arithmetic processing circuit, and more particularly to an arithmetic processing apparatus and an arithmetic processing circuit which can be applied to signal conversion such as correlation arithmetic, A/D (analog-digital) conversion, and D/A (digital-analog) conversion or to various arithmetic processes such as majority logic.

2. Related Background Art

A charge-scaling D/A converter, for example as described in ALLEN, HOLBERG, "CMOS ANALOG CIRCUIT DESIGN" P 534, is an example of the arithmetic processing apparatus for executing various processes as performing charge redistribution by one or more capacitors provided in an input portion thereof.

Further, Nao SHIBATA and Tadahiro OHMI, Tohoku University, reported another device called a neuro device, arranged with capacitances connected to the input thereof to execute various arithmetic operations by charge redistribution based on the capacitances and input voltages thereinto in "New-concept MOS transistor, realizing neuron function by a single unit" (NIKKEY MICRODEVICES, January 1992, p 101-).

These arithmetic processing apparatus, however, had the following problem. Since input capacitance due to parasitic capacitance and wiring capacitance, etc. existed in the input portion of comparator, dispersion appeared in gains of signals input into a comparator through the capacitors connected to the comparator, which caused output signals to have error components.

Particularly, when a plurality of devices with capacitances at input were used, gains of the respective devices differed from each other, which resulted in a problem of degrading arithmetic accuracy.

SUMMARY OF THE INVENTION

An object of the present invention is to realize an arithmetic processing apparatus for performing charge redistribution by one or more capacitances connected to the input portion of comparing means, which can suppress the dispersion or error of gains of signals input into comparators, thereby improving the arithmetic accuracy.

A further object of the present invention is to provide an arithmetic processing apparatus or circuit using a plurality of comparing means, each having one or more capacitances connected to an input portion thereof, wherein a sum of capacitances connected to each comparing means is equalized to those of the other comparing means and/or wherein a ratio of a sum of capacitances connected to each comparing means and an input capacitance of comparing means is equalized to those of the other comparing means.

BRIEF DESCRIPTION OF THE DRAWINGS

FIGS. 6A to 6D are timing charts to illustrate an example of operation where there is a difference between sums of capacitances in the circuit diagram of FIG. 5; and FIGS. 7A to 7D are timing charts to illustrate an example of operation according to the present invention in the circuit diagram of FIG. 5.

DETAILED DESCRIPTION OF THE PREFERRED EMBODIMENTS

The present invention has been made to achieve the above objects, and the objects were achieved by such an arrangement that the sums of the capacitances connected to the plural comparing means are equalized to each other or by such an arrangement that the ratios of input capacitance of comparing means and sum of capacitances connected thereto are equalized to each other.

Since gains at input of comparators become constant by the arrangement wherein the sum of capacitances connected to input of each comparator is equalized to those of the other comparators, the arithmetic accuracy can be improved.

Further, influence of the input capacitance $C_p$ can be decreased as follows: because the gains become constant if the ratio of the sum of capacitances connected to each comparator (as defined by Eq. 1) and the input capacitance $C_p$ is equalized to those of the other comparators, the influence of input capacitance may be adjusted by a method of changing the size of input device for comparator, adding a capacitance for adjustment, or the like where there are differences among the sums of the capacitances connected to the respective comparators.

As described above, the present invention can improve the arithmetic accuracy, because the gains are equal in the input portions of the respective comparing means also in the case where a plurality of devices with capacitances at input portions thereof are used.

It is noted here that the sums of capacitances or the ratios of sum of capacitances and input capacitance as described above do not have to be perfectly equal to each other, but a need is to obtain accuracy meeting each purpose.

[First Embodiment]

Figure 1:
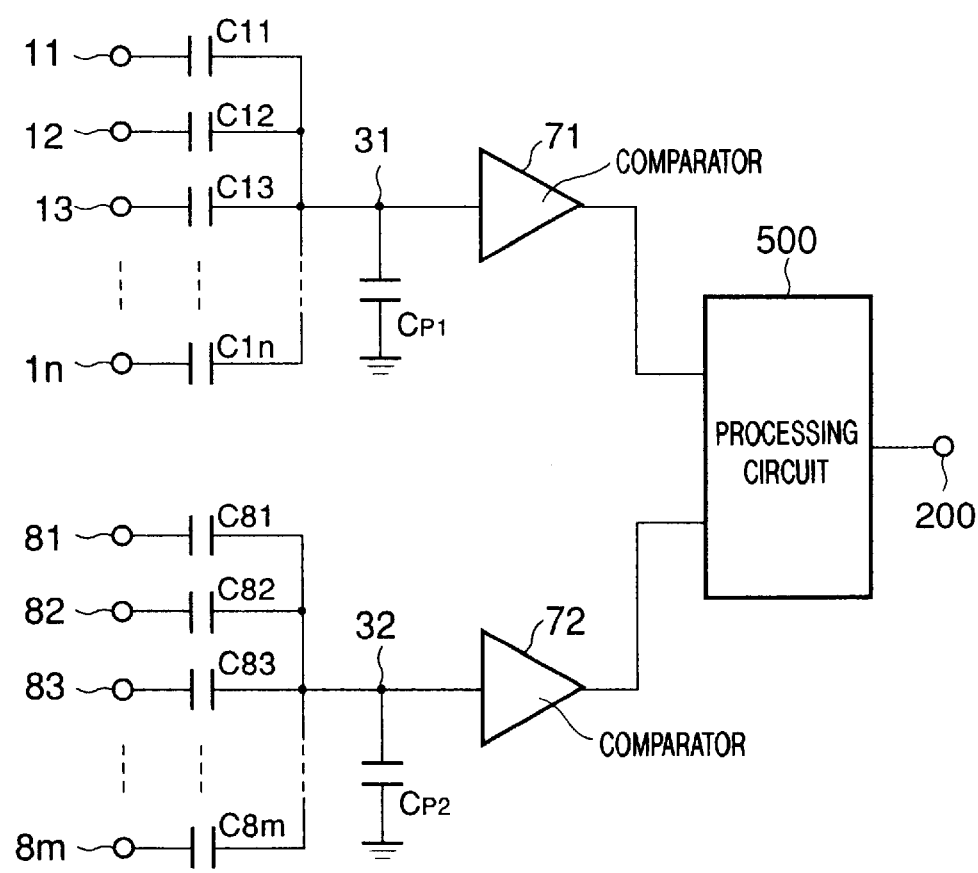
FIG. 1 is a schematic circuit diagram to illustrate a preferred example of circuit setup of the arithmetic processing apparatus according to the present invention.

FIG. 1 is a schematic circuit diagram to illustrate the arithmetic processing apparatus of the first embodiment of the present invention. In FIG. 1, 11, 12, 13 to 1n, 81, 82, 83 to 8m each denote input terminals, and $C_{11}$, $C_{12}$ to $C_{1n}$, $C_{81}$, $C_{82}$ to $C_{8m}$ each denote capacitances connected to the input terminals, which are connected through terminal 31, 32 to an input portion of comparator 71 or 72. Each of the comparators 71 and 72 amplifies a difference voltage between an input voltage and a threshold voltage $V_{TH}$ to compare them. In FIG. 1 the input terminals $C_{12}$ to $C_{1n}$ compose a set and the input terminals $C_{81}$ to $C_{8m}$ another set.

Reference numeral 500 designates a processing circuit connected to the comparators 71 and 72, and 200 an output terminal thereof.

In the above setup, supposing voltages input into the input terminals 11, 12, 13, . . . , 1n are $V_{11}$, $V_{12}$, $V_{13}$, . . . , $V_{1n}$, respectively, the amplitude of input voltage to the comparator 71 is given as follows.

$$(V_{11}C_{11}+V_{12}C_{12}+\ldots+V_{1n}C_{1n})/(C_{11}+C_{12}+\ldots+C_{1n})$$

For example, if $C_{11}=C_{12}=C_{13}=\ldots=C_{1n}=C$ then the amplitude becomes $(V_{11}+V_{12}+\ldots+V_{1n})/n$; if $C_{11}=C_{12}/2=C_{13}/4=\ldots=C_n/2^{n-1}$ then the amplitude becomes $(V_{11}+2V_{12}+4V_{13}+\ldots+2^{n-1}V_{1n})/(2^n-1)$; further, supposing $V_{11}=V$ and $V_{12}=V_{13}=\ldots=V_{1n}=0$, the input amplitude of the comparator becomes very small as $V/n$, $V/(2^n-1)$, respectively.

The same can be applied to the input of comparator 72.

Accordingly, the above fine voltage changes can be detected by setting the comparing voltage of comparators to appropriate values, which permits various arithmetic operations to be executed.

However, because actual devices have the input capacitance $C_p$ due to parasitic capacitance, wiring capacitance, etc. at input of comparator, the input amplitude becomes as follows.

$$(V_{11}C_{11}+V_{12}C_{12}+\ldots+V_{1n}C_{1n})/(C_{11}+C_{12}+\ldots+C_{1n}+C_p)$$

Thus, the input amplitude has a gain error due to influence of the input capacitance $C_p$, and thus comes to have an error to a determination voltage $V_{TH}$.

In the cases where complex arithmetics are carried out using a plurality of comparators with capacitances connected to the input as described above, and if the sum of capacitances connected to each comparator, $C_{11}+C_{12}+\ldots+C_{1n}$, differs from those of the other comparators, the input voltages of the comparators have different gain errors from each other, which resulted in the problem of degrading the arithmetic accuracy heretofore.

In the present invention, the sum of capacitances connected to the input of each comparator is equalized to those of the other comparators whereby the gains at the input of the comparators become constant, thus improving the arithmetic accuracy.

In detail, the present embodiment is so arranged that the sum of the capacitances connected to the first comparator 71, $C_{11}+C_{12}+\ldots+C_{1n}$, is equalized to the sum of the capacitances connected to the second comparator 72, $C_{81}+C_{82}+\ldots+C_{8m}$.

The closer the input capacitances $C_{p1}$, $C_{p2}$ due to parasitic capacitance, wiring capacitance, etc., of the respective comparators to each other, the smaller the gain errors. Then comparators of the same setup can be applied to the comparators 71 and 72. In the cases where complex arithmetic operations are carried out using a great number of comparators with capacitances connected thereto, comparators of the same setup can be used as the comparators, which simplifies design and fabrication of apparatus or circuit.

In the cases where there are a number of capacitances and the threshold value $V_{TH}$ of comparators needs to be shifted because of small gains, the threshold value $V_{TH}$ of the plural comparators can be shifted in the same manner, which presents an advantage of simplifying control of $V_{TH}$.

In order to decrease the influence of the input capacitance $C_p$, another effective method is to equalize the ratio of a sum of capacitances connected to each comparator as defined by Eq. 1 below the input capacitance $C_p$ to those of the other comparators.

$$\sum_{n=1}^{n} C_i \qquad \text{(Eq. 1)}$$

If the sum of capacitances connected to one comparator is different from that to the other comparator, the influence of input capacitance may be adjusted by a method of changing the size of input device of comparator, adding capacitance for adjustment, or the like. The arithmetic accuracy can also be improved similarly in the case of adjustment to equalize the ratios. It is a matter of course that this ratio can also be applied to the cases where the sums of capacitances are equal to each other.

Although the present embodiment does not illustrate a clamping method of floating gate as input of comparator, clamping is first effected in actual applications by a clamping method for clamping at the DC level such as GND or by a method for feeding an output of comparator back to the input so as to eliminate the influence of offset.

Of course, any other clamping method may be employed.

Figure 2:
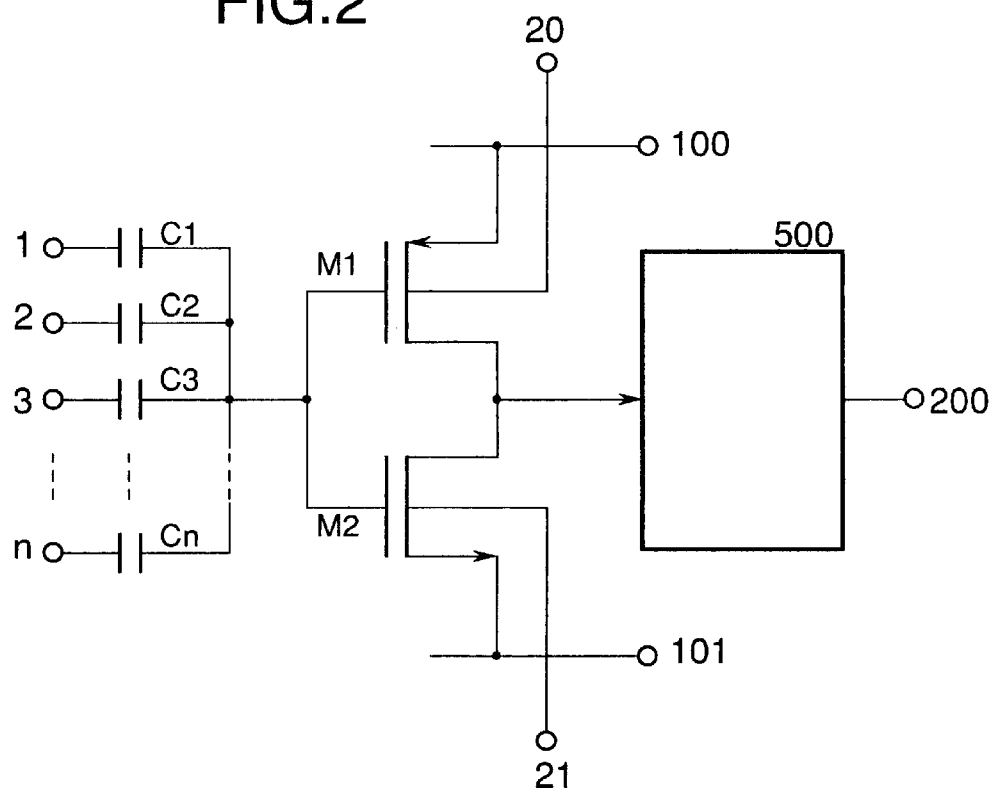
FIG. 2 is a circuit diagram to show an example of setup of a comparator constructed of a CMOS inverter.
Figure 3:
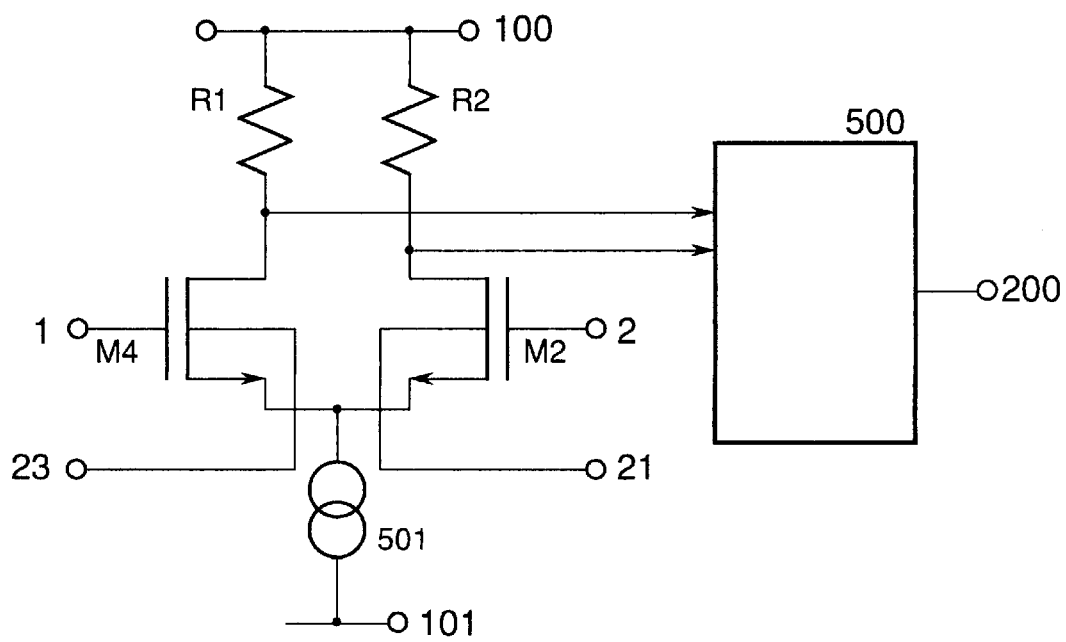
FIG. 3 is a circuit diagram to show an example of setup of a comparator constructed of a differential amplifier.

The comparators may be selected from those in an inverter structure as shown in FIG. 2, or those utilizing a differential amplifier as shown in FIG. 3. Further, comparators of another type may be applied as long as they can amplify a signal.

In FIG. 2 and FIG. 3, 20, 21, 23 designate back gates, 100 a $V_{DD}$ power-supply terminal connected to a power supply of a desired voltage, 101 a GND ground terminal, 501 a constant-current source, R1, R2 resistances, M1 a p-channel type MOS transistor, and M2, M4 n-channel type MOS transistors.

Although FIG. 1 illustrates the example including two comparators, the invention can be applied to the cases including three or more comparators, as apparent from the above description.

(Second Embodiment)

Figure 4:
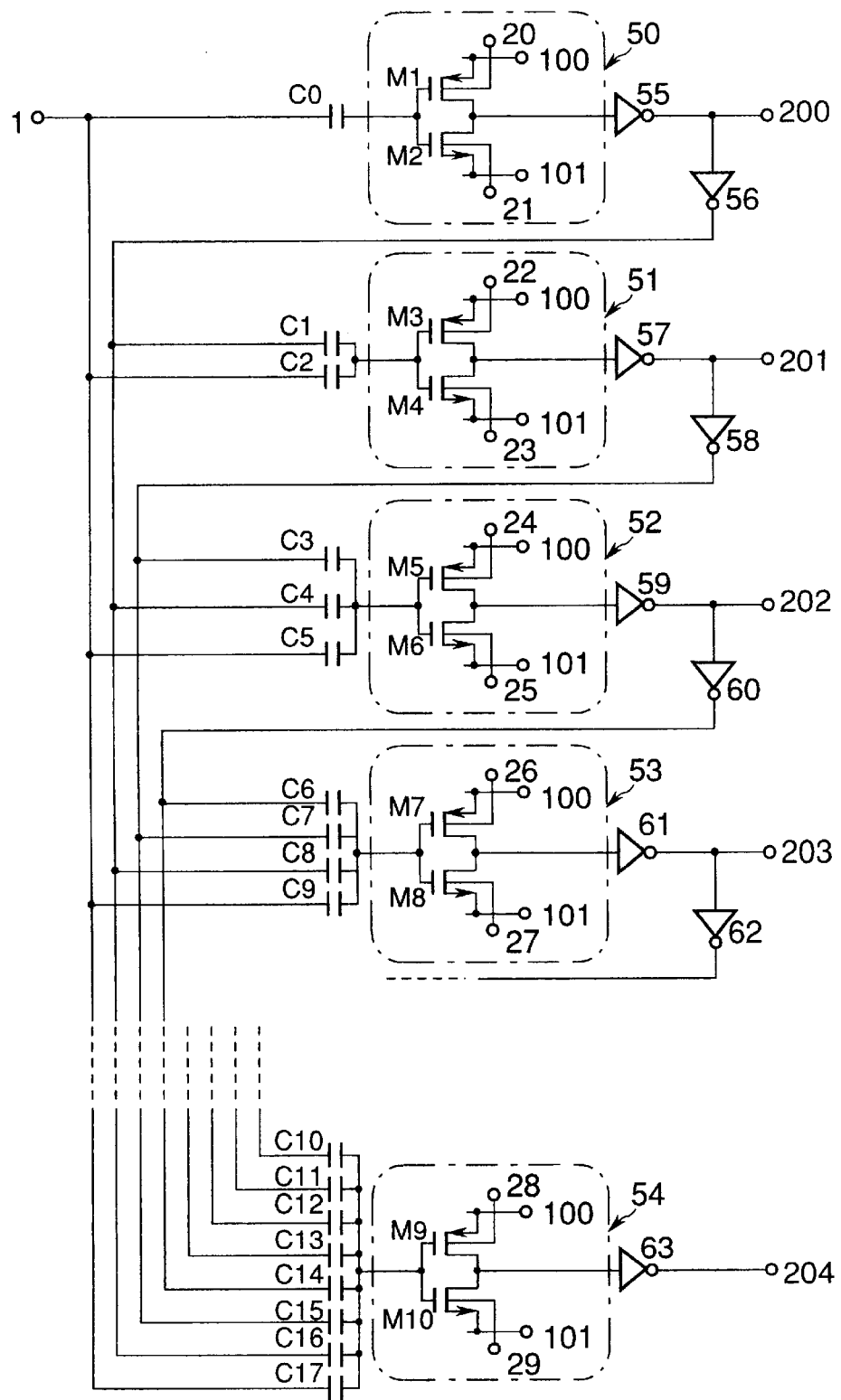
FIG. 4 is a schematic circuit diagram to show an 8-bit A/D converter as an arithmetic processing apparatus.

FIG. 4 is a schematic circuit diagram to illustrate an example in which the present invention is applied to a multi-step type 8-bit A/D converter.

In FIG. 4, 50 to 54 denote CMOS inverters, which are comparators, 55 to 63 CMOS inverters, $C_0$ to $C_{17}$ capacitances, 200 to 204 digital output terminals, and 1 an analog input terminal. Further, 20 to 29 designate back gates, M3, M5, M7, M9 p-channel type MOS transistors, and M6, M8, M10 n-channel type MOS transistors.

The analog input terminal 1 is connected to the input of comparator 50 and to the inputs of comparators 51, 52, 53, 54 through the respective capacitances $C_2$, $C_5$, $C_9$, $C_{17}$, and the output of the comparator 50 is connected to the digital output terminal (MSB) 200 through the inverter 55 and further to the inputs of the comparators 51, 52, 53, 54 through the inverter 56 and the respective capacitances $C_1$, $C_4$, $C_8$, $C_{16}$.

The output of the comparator 51 is connected to the digital output terminal 201 through the inverter 57 and further to the comparators 52, 53, 54 through the inverter 58 and the respective capacitances $C_3$, $C_7$, $C_{14}$. In this manner an output of a higher order bit is connected to inputs of comparators of all lower order bits through an inverter and respective capacitances in order.

Figure 5:
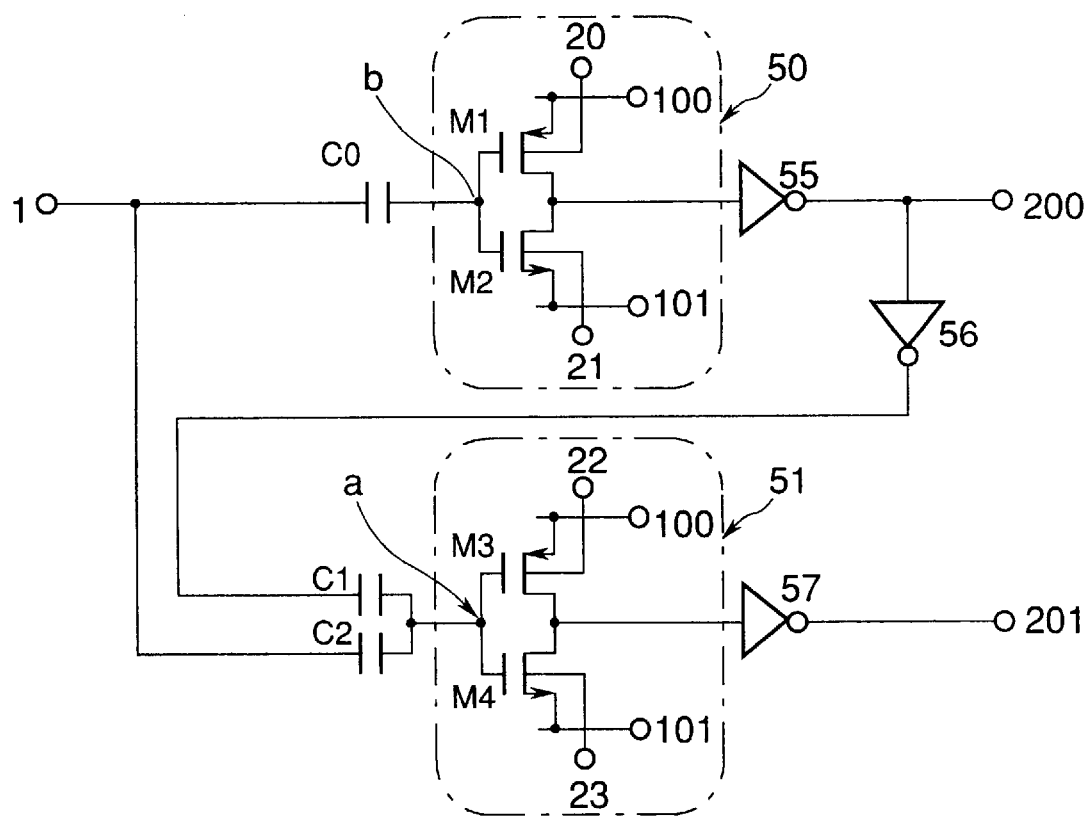
FIG. 5 is a schematic circuit diagram to illustrate a circuit setup for highest 2 bits in the 8-bit A/D converter shown in FIG. 4.

In order to simplify the description of the operation of the above setup, the following description concerns only the highest two bits in FIG. 4, referring to FIG. 5 to show the highest two bits and the timing charts shown in FIGS. 6A to 6D and FIGS. 7A to 7D to illustrate operations of the respective parts.

FIGS. 6A to 6D are timing charts at respective parts to show an example of the operation where the sums of capacitances are not equal in the circuit diagram of FIG. 5. In FIGS. 6A to 6D, FIG. 6A shows voltage changes at point b, which is the input portion of comparator 50 shown in FIG. 5, FIG. 6B shows voltage changes at the output terminal 200, FIG. 6C shows voltage changes at point a, which is the input portion of the comparator 51, and FIG. 6D shows voltage changes at the output terminal 201. Further, the solid lines represent a case where there is no influence of the input capacitance due to parasitic capacitance and wiring capacitance, and the dashed lines represent a case where there is influence of the input capacitance.

As shown by the solid lines in FIGS. 6A to 6D, when a voltage $V_b$ sufficiently lower than the threshold value (as supposed to be $V_{TH}=V_{DD}/2$ for explanation's sake) is input into the input of comparator 50 through the input terminal 1, the digital output terminal 200 is determined to be Low through the comparator 50 and inverter 55.

This result is inverted by the inverter 56, and one terminal of capacitance $C_1$ becomes equal to the power-supply voltage. Thus, the voltage $V_a$ at the input point a of comparator 51 is given by a value obtained by dividing a difference between the power-supply voltage $V_{DD}$ and $V_1$ by a capacitance ratio of $C_1$ and $C_2$ with a reference of voltage $V_1$ at the input terminal 1, as defined by the following equation.

$$V_a = V_1 + (C_1/(C_1+C_2))(V_{DD}-V_1)$$

Since $V_1$ is a sufficiently small value in this case, $V_a$ is smaller than the threshold value of comparator 51, and the output terminal 201 is thus determined to be Low.

With an increase of $V_1$, $V_a$ also increases, but because $V_1<V_a$, $V_a$ surpasses the threshold value of comparator 51 before $V_1$. Thus, the output 201 is inverted earlier to become High. When $V_1$ further increases to surpass the threshold value of comparator 50, the output 200 is inverted to become High, resulting in equalizing one terminal of $C_1$ to the ground potential. At this time, the potential at point a becomes a value obtained by dividing $V_1$ by the capacitance ratio of $C_1$ and $C_2$, as defined by the following equation.

$$V_{i\,a} = (C_2/(C_1+C_2))V_1$$

Thus, $V_a$ becomes lower than the threshold value of comparator 51 and thus the output of comparator 51 is inverted, resulting in changing the output 201 to Low. With a further increase of $V_1$, $V_a$ increases in proportion therewith. When $V_a$ again becomes greater than the threshold value of comparator 51, the output 201 becomes inverted to be High.

In the 8-bit A/D converter of FIG. 4, the lower order bits also work in the same operation to determine digital output values 202 to 204. Here, the input voltages of the comparators 50 to 54 in the above arrangement have such amplitudes as to become smaller in the descending order of bits because the capacitance division ratio becomes smaller with descent of bit order.

Since the input capacitance due to wiring capacitance, parasitic capacitance, etc. exists in the MOS transistors M1 to M10 constituting the comparators 50 to 54, the voltage input into the each comparator has a gain error like $V_b'$, $V_a'$ shown by the dashed lines in FIGS. 6A, 6C.

If the sums of the capacitances connected to the input terminals of the respective comparators are different from each other, the gains at input of the comparators are different from each other as explained in Embodiment 1. Output results of A/D in that case are shown by the dashed lines in FIGS. 6B and 6D.

The dashed lines in FIGS. 7A to 7D show results when the influence of input capacitance $C_p$ is reduced according to the present invention. FIGS. 7A to 7D are similar to those as explained in FIGS. 6A to 6D.

As seen from FIG. 6D and FIG. 7D, the dashed line of FIG. 6D shows great dispersion of widths $T_1$, $T_2$, $T_3$, $T_4$ of changes of respective digital values, which degrades linearity of the A/D converter, whereas the dashed line of FIG. 7D according to the present invention shows $T_1=T_2=T_3$ except that $T_4$ is different from those, which confirms that the linearity, which is an important characteristic of A/D converter, is not degraded in spite of occurrence of gain error of A/D converter.

In the case of the converter according to the present invention, even if $T_1$ differs due to dispersion of clamping voltage or the like, the relation of $T_2=T_3$ can be maintained, which confirms that the linearity is not degraded in spite of occurrence of offset error.

As explained above, in the case where the A/D converter is constituted using a plurality of comparators with capacitances connected to the inputs thereof according to the present invention, the gains at input of the comparators become constant by equalizing the sums of the capacitances connected to the inputs of the respective comparators to each other, which can improve the arithmetic accuracy and which can decrease degradation of linearity of A/D converter.

Since the same effect can be achieved by equalizing the ratio of the sum of capacitances connected to each comparator (as defined in Eq. 1) and the input capacitance $C_p$ to those of the other comparators so as to decrease the influence of the input capacitance $C_p$, the influence of the input capacitance may be adjusted by the method of changing the size of input device of comparator, adding capacitance for adjustment, or the like in the cases where the sums of capacitances connected to the respective comparators are different from each other.

Although the present embodiment does not illustrate the clamping method of floating gate as input of comparator, clamping is first effected in actual applications by the clamping method for clamping at the DC level such as GND or by the method for feeding an output of comparator back to the input so as to eliminate the influence of offset. Of course, any other clamping method may be employed.

The comparators may be selected from those in the inverter structure as shown in FIG. 2, or those utilizing the differential amplifier as shown in FIG. 3. Further, comparators of another type may be applied as long as they can amplify a signal.

As detailed above, the present invention can improve the arithmetic accuracy of the arithmetic processing apparatus using a plurality of comparing means each with one or more capacitances connected to the input portion thereof, because the gains at the input portions of the respective comparing means become constant even in the case of using the plurality of devices with capacitances at the input portions by equalizing the sums of the capacitances connected to the respective comparing means to each other or by equalizing the ratio of the sum of the capacitances connected to each comparing means and the input capacitance of the comparing means to those of the other comparing means.

It is noted here that the sums of capacitances or the ratios of sum of capacitances and input capacitance as described above do not have to be perfectly equal to each other, but a need is to achieve accuracy to match each purpose.

In the present invention, the closer the input capacitances of the respective comparators to each other, the smaller the gain errors, which permits same comparators to be used as the comparators. Thus, same comparators can also be used where complex arithmetics are carried out using a great number of comparators with capacitances connected thereto, which simplifies design and fabrication.

In the case where the threshold value of comparators needs to be shifted because of small gains resulting from too many capacitances, the threshold value of plural comparators may be shifted in a same manner, which simplifies the control of threshold value.

This effect of the present invention allows mass production of same devices, and is suitable particularly for applications to semiconductor integrated circuits with good relative accuracy of devices.

Also in the case where, for example, the A/D converter is constructed of a plurality of comparators with capacitances connected to inputs thereof, the present invention may be applied to equalize the sums of the capacitances connected to the inputs of the respective comparators to each other, thereby making the gains at input of the comparators constant, which can improve the arithmetic accuracy and which can decrease degradation of linearity of A/D converter.

It is noted that the present invention is by no means limited to the examples as described above, but may include various modifications and combinations within the scope of the spirit of the invention.

What is claimed is:

1. An arithmetic processing apparatus having a plurality of comparing means, each having one or more capacitances connected to an input portion thereof, wherein a sum of said capacitances connected to the input portion of each said comparing means is substantially equalized among said plurality of comparing means.

2. The arithmetic processing apparatus according to claim 1, wherein a ratio of the sum of said capacitances and an input capacitance of each said comparing means is further arranged to be substantially equalized among the plurality of comparing means.

3. In an arithmetic processing circuit having a plurality of comparing means, each having one or more capacitances connected to an input portion thereof, an arithmetic processing circuit is characterized in that a ratio of a sum of said capacitances connected to the input portion of each said comparing means and an input capacitance of each said comparing means is substantially equalized among said plurality of comparing means.

4. The arithmetic processing circuit according to claim 3, wherein said comparing means has an inverter setup.

5. The arithmetic processing circuit according to claim 3, wherein said comparing means has a differential amplifier.

6. The arithmetic processing circuit according to claim 3, wherein said comparing means has MOS transistors.

7. An arithmetic processing apparatus comprising a plurality of capacitors, a plurality of comparing means connected to said capacitors, and a processing circuit respectively connected to said plurality of comparing means, wherein said capacitors are grouped correspondingly to the plurality of comparing means, first input terminals of said capacitors being capable of inputting a signal for each group, second input terminals of said capacitors being commonly connected to input sections of said corresponding comparing means, said plurality of comparing means being connected in parallel to said processing circuit, and sums of said capacitors for respective groups being equal.

8. An apparatus according to claim 7, wherein numbers of said capacitors for respective groups are different.

9. An arithmetic processing apparatus comprising a plurality of capacitors, and a plurality of comparing means connected to said capacitors, wherein said capacitors are grouped correspondingly to said plurality of comparing means, first terminals of said capacitors are capable of inputting a signal for each group, second terminals of said capacitors are electrically connected in common to input sections of said correspond comparing means, said plurality of comparing means are connected in parallel to a processing circuit, and a ratio of a sum of capacitances of capacitors of a particular group to an input capacitance of said comparing means corresponding to said particular group is substantially equal for each of the groups.

10. An apparatus according to claim 9, wherein numbers of said capacitors for respective groups are different.

11. An apparatus according to claim 9, wherein numbers of said capacitors for respective groups are different, and a result of comparing of the group in a previous stage is inputted into capacitors in a following stage.

* * * * *

UNITED STATES PATENT AND TRADEMARK OFFICE
CERTIFICATE OF CORRECTION

PATENT NO. : 5,864,495

DATED : January 26, 1999

INVENTOR(S) : YUKIHIKO SAKASHITA ET AL.

It is certified that error appears in the above-identified patent and that said Letters Patent is hereby corrected as shown below:

COLUMN 5

Line 22, "$V_{ia} = (C_2/(C_1+C_2))V_i$" should read --$V_a = (C_2/(C_1+C_2))V_i$--.

COLUMN 8

Line 19, "correspond" should read --corresponding--.

Signed and Sealed this

Tenth Day of August, 1999

Attest:

Q. TODD DICKINSON

Attesting Officer

Acting Commissioner of Patents and Trademarks